United States Patent [19]
Amar et al.

[11] Patent Number: 5,982,314
[45] Date of Patent: Nov. 9, 1999

[54] SELF-TIMED MULTIPLIER FOR GAIN COMPENSATION AND REDUCED LATENCY IN ANALOG TO DIGITAL CONVERTERS

[75] Inventors: Aryesh Amar, Nashua; Bruce P. Del Signore, Hollis, both of N.H.

[73] Assignee: Cirrus Logic, Inc., Fremont, Calif.

[21] Appl. No.: 08/883,824

[22] Filed: Jun. 27, 1997

[51] Int. Cl.⁶ .................................................. H03M 3/00
[52] U.S. Cl. ...................................... 341/143; 708/718.01
[58] Field of Search ................................... 341/142, 155, 341/143, 166; 708/718.01, 718.02

[56] References Cited

U.S. PATENT DOCUMENTS 4,633,386  12/1986  Terepin .................................. 364/200

OTHER PUBLICATIONS de Angel et al., "A New Asynchronous Multiplier using Enable/Disable CMOS Differential Logic," Dept. of Electrical and Computer Engineering, University of Texas at Austin, 4 pages (1994).

Jacobs, et al., "Self–Timed Integrated Circuits for Digital Signal Processing Applications," Dept. of EECS, University of California, Berkeley, pp. 197–207 (1988).

Anthony J. McAuley, "Four State Asynchronous Architectures," IEEE, vol. 41, No. 2, pp. 129–142 (Feb. 1992).

Dick Pountain, "Computing Without Clocks," BYTE (Jan. 1993).

Aryesh Amar, "ALUs, Multipliers and Dividers with Completion Signals Suitable for Inclusion in an Asynchronous Environment", thesis (Dec. 1994).

Primary Examiner—Howard L. Williams
Assistant Examiner—Peguy JeanPierre
Attorney, Agent, or Firm—Brian W. Peterman; J. P. Violette

[57] ABSTRACT

A self-timed multiplier and method are disclosed together with an analog to digital converter (ADC), which reduces ADC latency without requiring large silicon areas for implementation. The self-timed multiplier may be utilized by delta-sigma ADCs to perform gain compensation multiplications at the end of convolution, or may be used by other ADC designs or ADC systems for multiplications required during each convolution. The self-timed multiplier utilizes cascaded adders that produce completion signals to isolate the operation of the self-timed multiplier from the system clock of the ADC. The multiplier disclosed provides a self-timed, asynchronous circuit that will complete the desired multiplication in the time it takes for the required additions to propagate through the cascaded adders. This propagation time preferably falls within a single system clock cycle of the ADC, and the self-timed multiplier disclosed is particularly advantageous for ADCs with relatively slow system clock speeds for which a multiplication may be completed within a single system clock cycle. The self-timed multiplier may also be made data dependent to save power and to reduce the time required for the additions to propagate through the cascaded adders.

28 Claims, 8 Drawing Sheets

SELF-TIMED MULTIPLIER FOR GAIN COMPENSATION AND REDUCED LATENCY IN ANALOG TO DIGITAL CONVERTERS

BACKGROUND OF THE INVENTION

1. Field of the Invention

The present invention relates to multiplier circuits for analog to digital converters (ADCs). More particularly, the present invention relates to implementations for multiplier circuits to perform gain compensation multiplications and other multiplications required by an ADC during each convolution and to reduce latency in ADC performance.

2. Description of Related Art

Multiplication of two binary numbers, such as an M×N bit multiplication, is an inherent part of analog to digital converters (ADCs). Some ADCs require a multiplication during each system clock cycle, whereas others require multiplication only once per conversion to gain up or down the digital word at the end of each convolution of the filter. The latency of an ADC, which refers to the delay time it takes for an ADC to receive an input and provide a converted output, is dependent upon the multiplications required by the ADC and the implementation chosen to accomplish these multiplications.

In general terms, a multiplication may be achieved in an integrated circuit by performing a sequence of add and shift operations. Numerous implementations have been developed for performing a multiplication, such as parallel, partially parallel, serial/parallel, and serial architecture implementations.

In fully parallel architectures, all partial products for the multiplication are formed first, and then added to give the desired result. Partially parallel architectures form some of the partial products and then combine them to give the desired result. Depending on the system clock frequency and the size of the operands, parallel architectures can be made fast so that the multiplication is completed in one system clock cycle. Thus, by using parallel multipliers to perform required multiplications, ADCs have obtained decreased latency and increased throughput. Parallel and partially parallel multipliers, however, make poor use of silicon area, because at any point in time most of the adders in the multiplier are idle.

With an M×N bit multiplication using serial/parallel architecture and serial architecture multipliers, the number of cycles required to complete multiplications typically increases resulting in a corresponding increased latency in the performance of ADCs. However, the silicon area required for implementation of these architectures typically decreases, depending upon the particular design. Fully serial multipliers take M×N cycles to complete a multiplication, but have the best use of silicon area. Serial/parallel multiplier implementations require M+N cycles using carry-save adders, and require M+1 or N+1 cycles using carry propagate adders. Depending on the multiplier implementation utilized, therefore, it may take 1, N+1, M+1, M+N, or M×N cycles to complete a required multiplication.

Serial architectures for ADC multipliers, therefore, provide the best use of silicon area but create the highest latency in the ADC performance, while parallel architectures create the lowest latency in ADC performance but have the worst use of silicon area. In addition, for ADCs that require only a single multiplication operation per convolution, such as a single gain compensation multiplication, parallel and partially parallel multipliers are impractical because of the severe cost in silicon area required for these implementations, and serial multipliers are impractical because they create too much latency in ADC performance.

SUMMARY OF THE INVENTION

In accordance with the present invention, a self-timed multiplier and associated method reduce latency in analog to digital converter (ADC) performance without requiring large silicon area for implementation. The self-timed multiplier has self-timed circuitry that receives an N-bit input and an M-bit input and that performs an M×N bit multiplication.

In more detailed embodiments, the M×N bit multiplication may be a gain compensation multiplication required by a delta-sigma ADC. The self-timed multiplier may perform the required multiplication within a single ADC system clock cycle. The self-timed circuitry may employ a conventional carry-propagate add-shift serial-parallel architecture with cascaded adders that produce internal completion signals along with control circuitry to determine when the cascaded adders have completed the multiplication and to provide a signal indicating when the multiplication has completed.

DESCRIPTION OF THE PREFERRED EMBODIMENTS

Figure 1A:
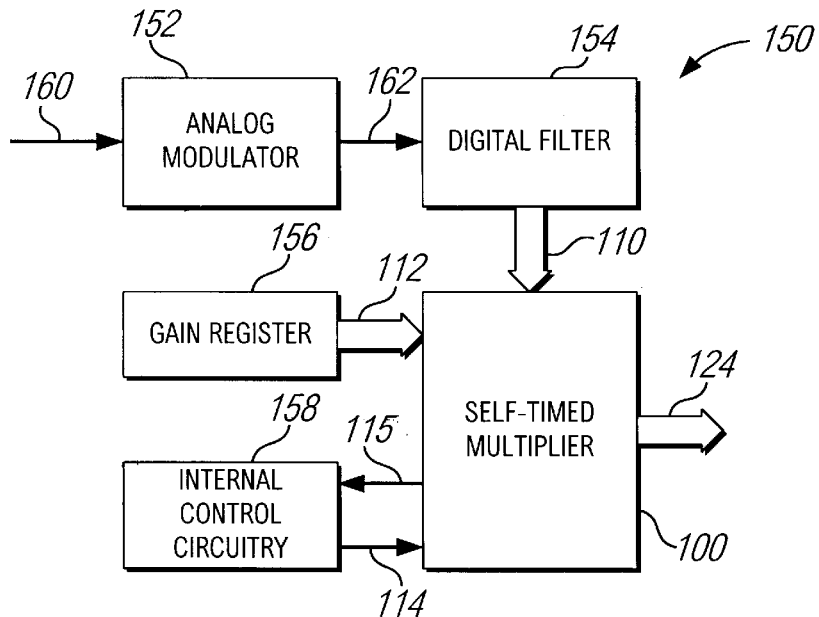
FIG. 1A is a block diagram of a delta-sigma analog to digital converter using a self-timed multiplier for gain compensation calculations, according to the present invention.

FIG. 1A is a delta-sigma analog to digital converter (ADC) 150 utilizing a self-timed multiplier 100 as a gain compensation multiplier, according to the present invention. Delta-sigma ADC 150 may be a conventional delta-sigma ADC. Analog modulator 152 samples analog input 160 and provides 1-bit sampled data 162 to digital filter 154. Although delta-sigma ADC 150 does not require a multiplication to provide a digitized result from analog input 160, the digitized result often needs to be gained up or down to compensate for gain errors. To achieve this gain compensation at the end of each convolution cycle with reduced latency, an M×N bit gain compensation multiplication is performed utilizing self-timed multiplier 124. Gain compensated output 124 is then provided to the user. N-bit digital word 110 is provided as a converted digital word from digital filter 154 of delta-sigma ADC 150. M-bit multiplicand 112 is provided by an on-chip gain register 156 of delta-sigma ADC 150. Gain register 156 contains a value supplied by the user or a value resulting from a previous gain calibration performed by delta-sigma ADC 150. Because delta-sigma ADC 150 has already produced a converted output data word 110 from analog input 160, it is preferable that the gain compensation multiplication be completed as quickly as possible to reduce the latency of the delta-sigma ADC 150 in providing result 124 to the user. Although internal control circuitry 158 provides signals 114 to self-timed multiplier 124 including a system data clock signal, self-timed multiplier 124 performs the gain compensation multiplication independent of these signals and the system data clock once the gain compensation multiplication is initiated. Self-timed multiplier 100 provides signal 115 to internal control circuitry 158 when the gain compensation multiplication has been completed. By operating in a self-timed fashion, the self-timed multiplier 100 reduces latency in the delta-sigma ADC 150.

Figure 1B:
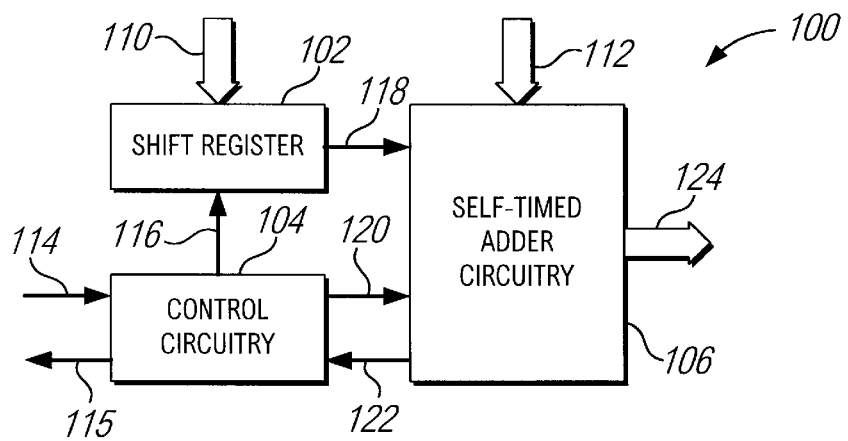
FIG. 1B is a block diagram of a self-timed multiplier according to the present invention.

FIG. 1B shows a block diagram of self-timed multiplier 100, according to the present invention. Self-timed multiplier 100 includes shift register 102, self-timed adder circuitry 106, and control circuitry 104 to produce M×N multiplication output 124. M-bit value 112 is loaded into self-timed adder circuitry 106. N-bit value 110 is a parallel loaded input to shift register 102, which may be N-bits in size. Control circuitry 104 receives signals 114 from internal control circuitry of the ADC. Control circuitry 104 provides control signals 116 to shift register 102 and control signals 120 to self-timed adder circuitry 106. Shift register 102 also provides input signals 118 to self-timed adder circuitry 106. Self-timed adder circuitry 106 provides signals 122 back to control circuitry 104 to indicate when each multiplication operation has completed. Control circuitry 104 provides a signal 115 when the self-timed multiplier 100 has completed the required multiplication. The function of shift register 102 is to provide N-bit value 110 to self-timed adder circuitry 106 one bit at a time and, if desired, may be implemented with other circuitry, such as a multiplexer combined with a counter circuit. In addition to use in gain compensation for a delta-sigma ADC 150, self-timed multiplier 100 may be utilized in other ADC designs for multiplications required during each convolution. The values of M and N, as well as the system clock speed of the ADC, depend upon the ADC design and the multiplication needed for the convolution cycle performed by the ADC.

Figure 1C:
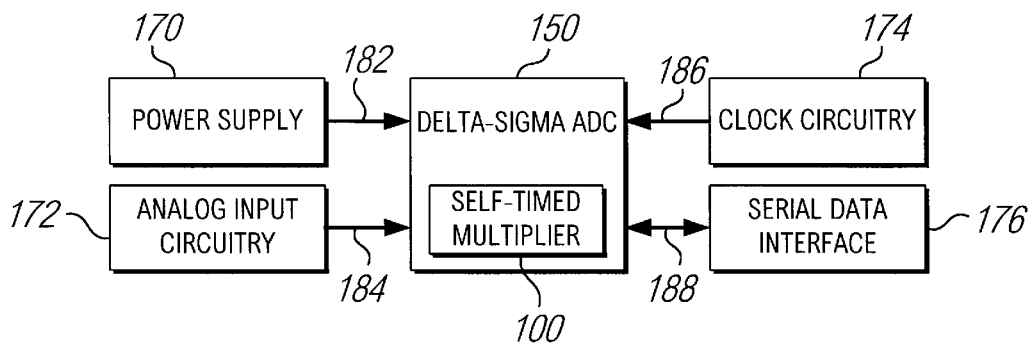
FIG. 1C is a block diagram of a delta-sigma analog to digital converter, with a self-timed multiplier, connected to external circuitry, according to the present invention.

FIG. 1C is a block diagram of delta-sigma ADC 150, with self-timed multiplier 100, connected to external circuitry, according to the present invention. Power supply 170 and clock circuitry 174 are connected to delta-sigma ADC 150 and provide a power supply input 182 and a timing signal 186, respectively. Delta-sigma ADC 150 receives an analog input 184 from analog input circuitry 172, and communicates with an external serial data interface 176 through bus 188. The analog input 184 provides a voltage and may be from a variety of sources, such as a thermocouple device.

Figure 2A:
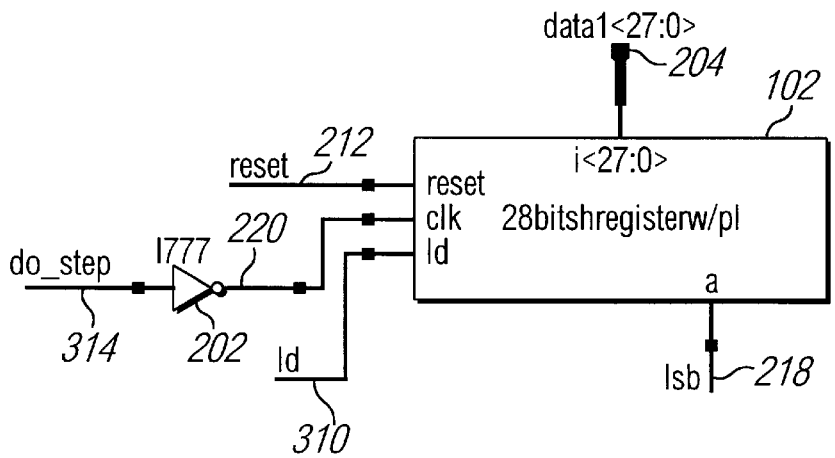
FIG. 2A is a block diagram of an embodiment of a shift register, according to the present invention.
Figure 2B:
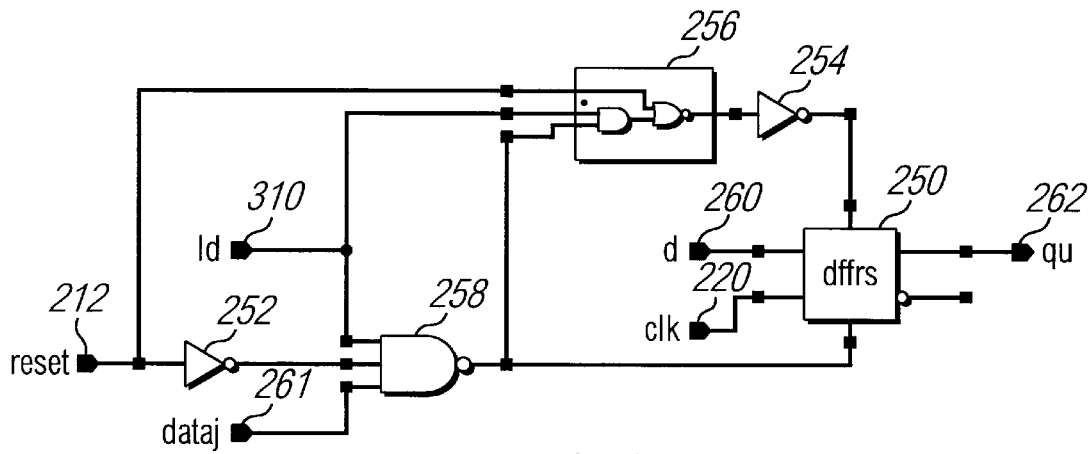
FIG. 2B is a block diagram of an embodiment of a flip-flop and logic circuitry that may be used in the shift register of FIG. 2A.
Figure 3:
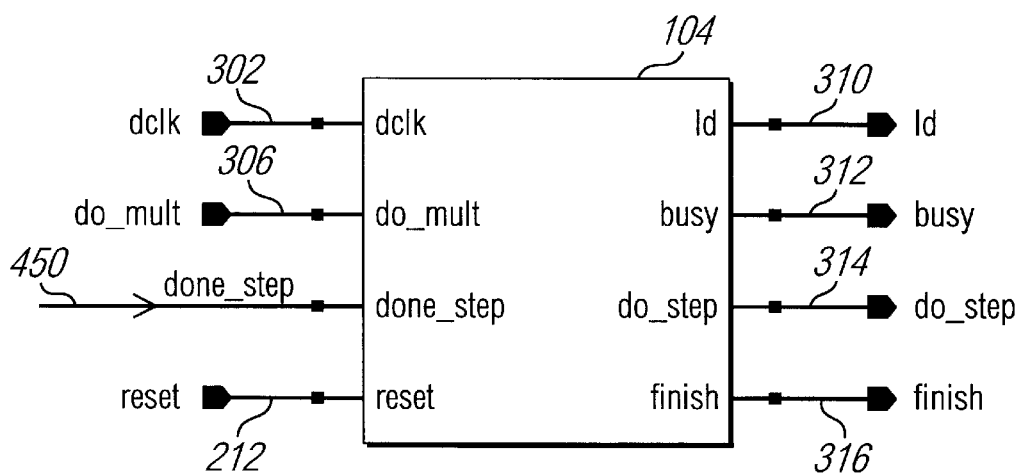
FIG. 3 is a block diagram of an embodiment of control circuitry, according to the present invention.
Figure 4:
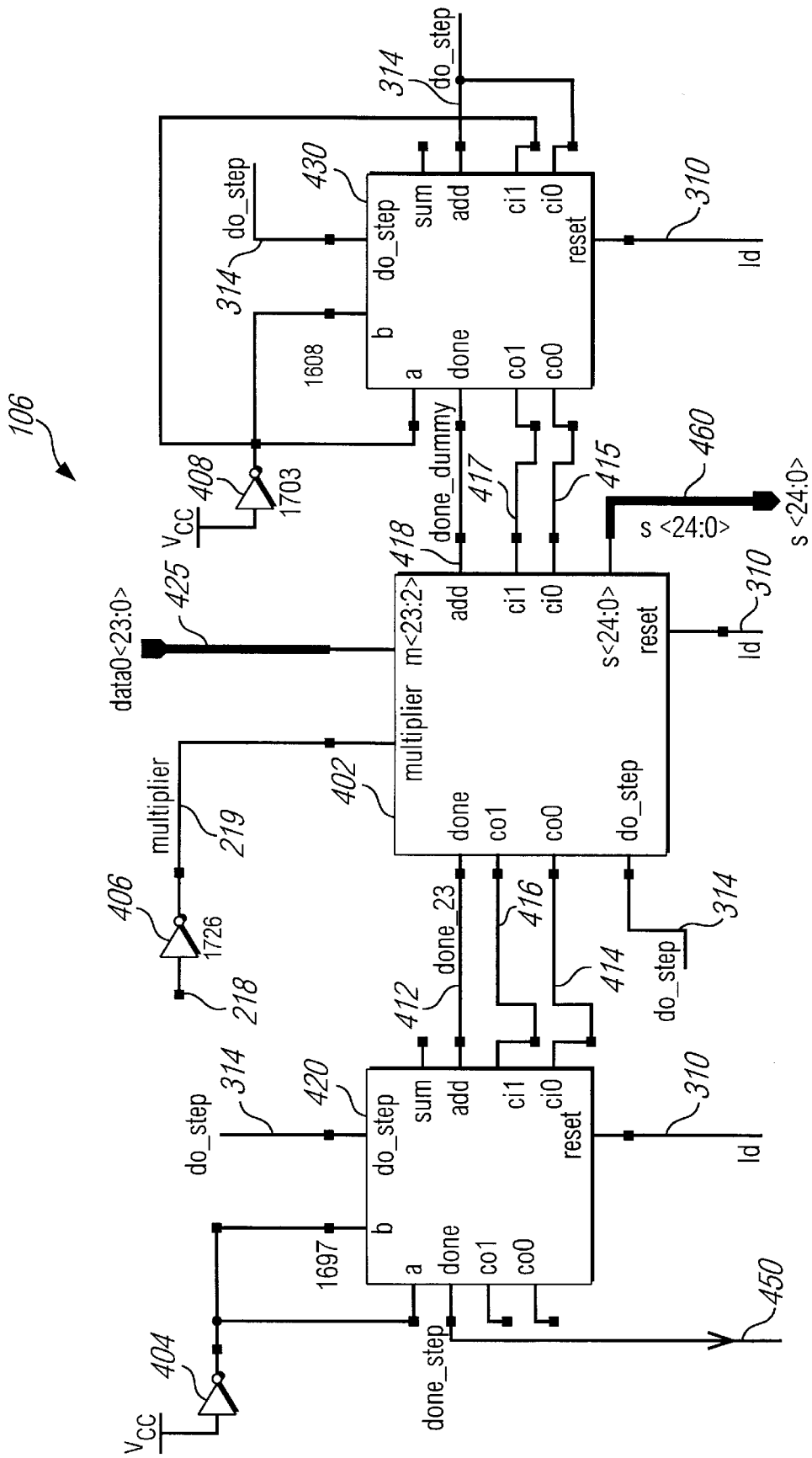
FIG. 4 is a block diagram of an embodiment of dummy input and output adders connected to self-timed adder circuitry, according to the present invention.
Figure 5:
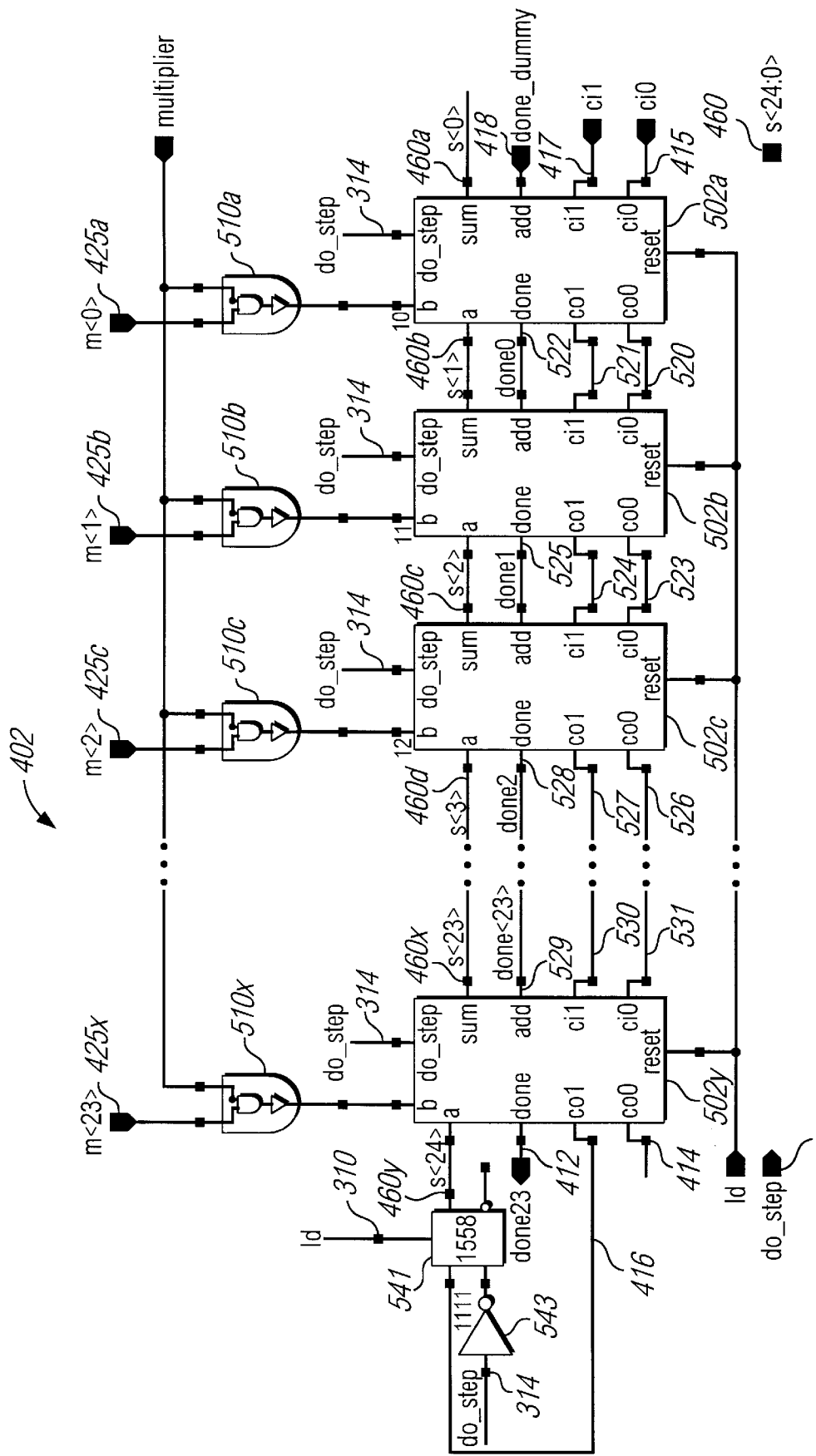
FIG. 5 is a block diagram of an embodiment of cascaded carry-propagate adders, according to the present invention.
Figure 6:
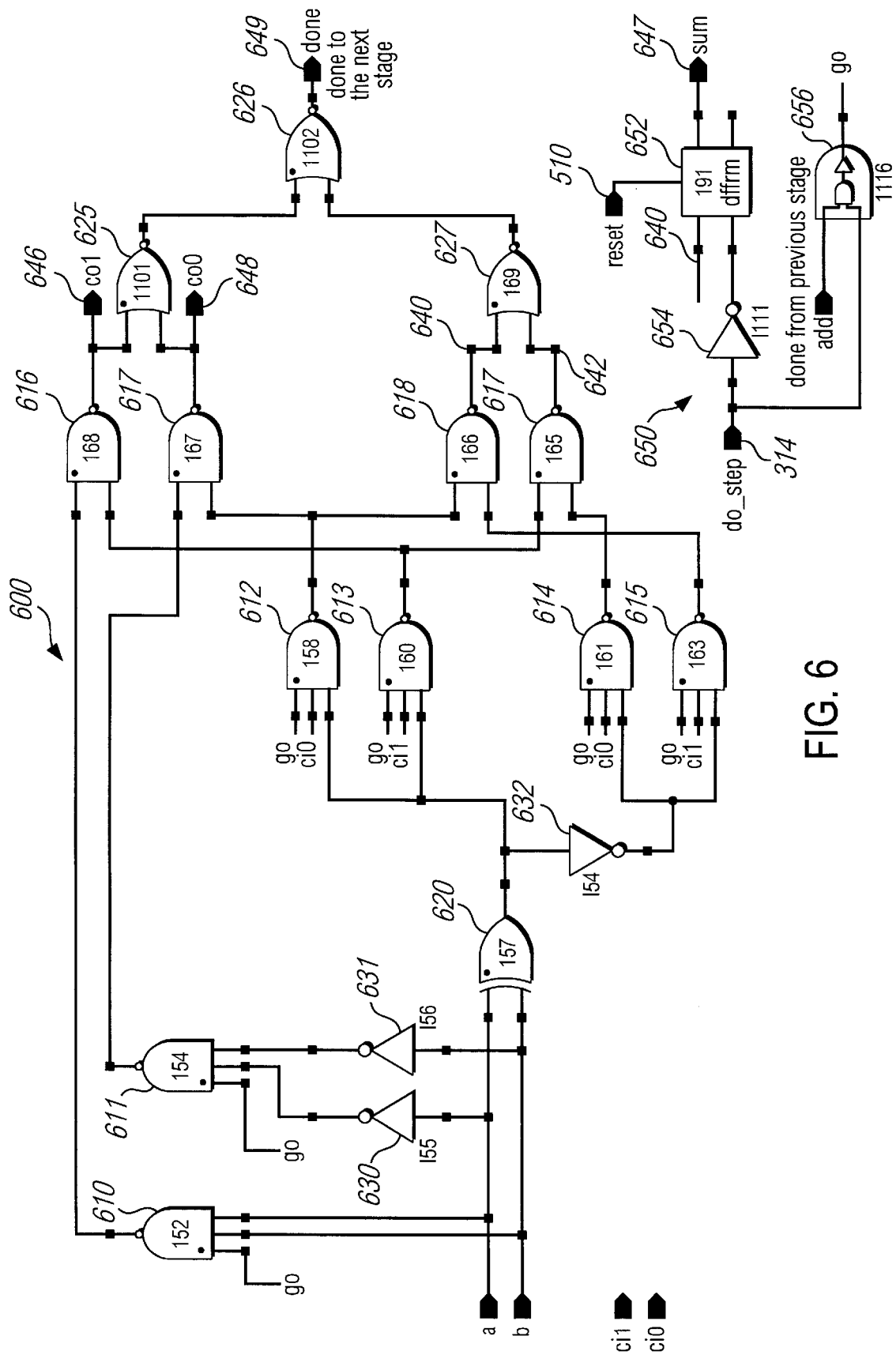
FIG. 6 is a circuit diagram of an embodiment of a carry-propagate adder, according to the present invention.
Figure 7:
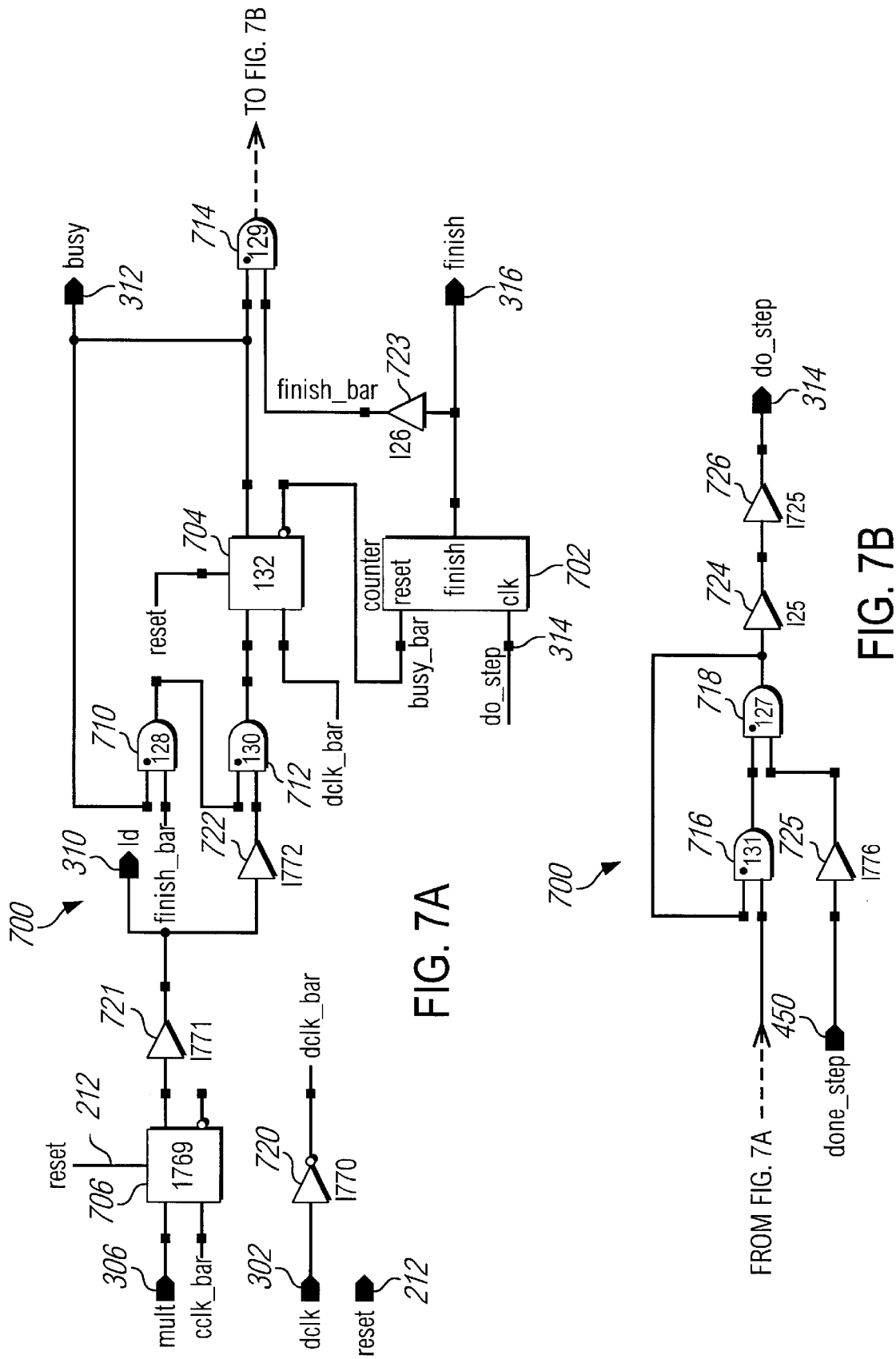
FIG. 7A and FIG. 7B are a circuit diagram of an embodiment of control circuitry, according to the present invention.

FIGS. 2–5 are block diagrams that depict different aspects of an embodiment of a self-timed multiplier according to the present invention. FIGS. 2–4 together show the overall multiplier architecture, and FIG. 5 shows a block diagram of cascaded adders. FIG. 6 shows a detailed circuit diagram of an adder. FIGS. 7A and 7B show a detailed circuit diagram of control circuitry. In these drawings, a design for a 24×28 bit multiplication is depicted for the M×N bit multiplication. The size of M and N may be modified as desired depending upon the particular multiplications required by the ADC and the ADC design.

As shown in FIGS. 4–5, the self-timed 24×28 bit multiplier may be implemented using a basic add and shift multiplier structure with carry-propagate signals. Only one 24-bit row address is required, with 28 internal cycles to finish the multiplication. In each cycle, a new partial product is formed and added to the previously stored partial sum. During the first 27 internal cycles, the least significant bits of the result are available serially, one bit per cycle. The most significant 25 bits of the result are produced during the $28^{th}$ cycle. Carries are allowed to propagate, but in an orderly manner. According to the present invention, a novel adder design is used to generate a done signal for each adder, and each adder issues a local done signal using a three-state code representation for the dual-rail sum and carry. This implementation requires only one system clock cycle to complete the multiplication, without taking up large amounts of silicon area. Thus, low latency is achieved without incurring all area penalty.

FIG. 2A is an embodiment of the shift register 102 according to the present invention depicting a 24×28 bit multiplication with shift register 102 being 28 bits in size. Shift register 102 performs a parallel load of the parallel "data1<27:0>" signal 204 into the data input (i<27:0>) of the shift register upon assertion of the "ld" signal 310 on its load (ld) input. Shift register 102 has the "do_step" signal 314 applied to its clock (clk) input through inverter 202 (I777). This signal, therefore, is "do-step_step b" or "clk" signal 220 when it reaches the clock (clk) input. The shift register 102 may also have a reset (reset) input that may receive a "reset" signal 212, a shift output (o) that provides the next least-significant-byte of the shift register as the "lsb" signal 218 on each clock. (It is noted that the suffix "_b" is used to denote a signal that is inverted from a matching signal without the suffix designation or a signal that is asserted when at a low logic level.) Shift register 102 may be implemented with 28 flip-flops with parallel load capabilities using asynchronous preset and clear overrides.

FIG. 2B is a block diagram of an embodiment of logic circuitry connected to a flip-flop 250 (dffrs) that that may be used in shift register 102. The logic circuitry may include: (1) complex AND/NOR gate 256; (2) NAND gate 258, and (3) inverters 252 and 254. The logic circuitry may receive as inputs the "reset" signal 212, the "ld" signal 310, the "clk" signal 220, the "dataj" signal 261, and the "d" signal 260. The "dataj" signal 261 is the value loaded in the flip-flop 250 when the "ld" signal is a logic level "1". The "d" signal 260 is the data input that may be shifted into the flip-flop 250 from the previous flip-flop. The "qu" signal is the output of the flip-flop 250 that is provided to the next flip-flop. Any time the "reset" signal 212 is at a logic level "1", the "qu" signal 262 is a logic level "0". When the "reset" signal 212 is at a logic level "0" and the "ld" signal 310 is at a logic level "1", the "qu" signal 262 will equal the "dataj" signal 261. With the "reset" signal 212 is at logic level "0" and the "ld" signal 310 at a logic level "0", the "d" signal is shifted into the flip-flop 250 on the rising edge of the "clk" signal 220.

FIG. 3 is an embodiment of control circuitry 104 according to the present invention. Control circuitry 104 includes a data clock (dclk) input receiving the "dclk" signal 302, a perform multiplication (do_mult) input receiving the "do_mult" signal 306, a reset (reset) input receiving the "reset" signal 212, and a step completed (done_step) input receiving the "done_step" signal 450. Control circuitry 104 receives the "dclk" signal 302, the "do_mult" signal 306, and the "reset" signal 212 as signals 114 from internal control circuitry of the ADC. Control circuitry 104 may also have a load (ld) output applying the "ld" signal 310, a multiplier busy (busy) output applying the "busy" signal 312, a perform step (do_step) output applying the "do_step" signal 314, and a multiplier finished (finish) output applying the "finish" signal 316.

FIG. 4 depicts a block diagram of an embodiment for the self-timed adder circuitry 106. Self-timed adder circuitry 106 includes cascaded adder circuit 402, an input dummy adder 430, and an output dummy adder 420. The "do_step" signal 314 and the "ld" signal 310 are applied to input dummy adder, the output dummy adder, and the cascaded adder circuit 402. In this embodiment, cascaded adder circuit 402 includes 24 carry propagate adders that provide the 25-bit output sum 460 (s<24:0>). The dummy adders 420 and 430 may be of the same structure as described for the adders below, and are included to alleviate problems with setup and hold time requirements for the first and last adders within cascaded adder circuit 402. Certain inputs of the dummy adders 420 and 430 are tied low through inverters 404 and 408, which have their respective inputs tied to Vcc. Dummy input adder 430 provides time for the inputs to the first cascaded adder to settle, whereas dummy output adder 420 provides time for the setup conditions of the storage elements (e.g., flip-flops).

The dummy adders 430 and 420, and the 24 cascaded adders 502a, 502b, 502c . . . 502x, have inputs for the values (a, b) to be added, an add command (add) input, a perform step (do_step) input, a reset (reset) input, a carry 0 input (ci0), and a carry 1 input (ci1). They also have a sum (sum) output, a completion (done) output, a carry 0 output (co0), and a carry 1 output (co1). The reset (reset) input receives the "ld" signal 310, which acts to reset the flip-flops in the cascaded adder circuit 402 and the dummy adders 430 and 420 when the shift register 102 is loaded by control circuitry 104 through the assertion of the "id" signal 310. The perform step (do_step) inputs receive the "do_step" signal 314 from control circuitry 104.

The cascaded adder circuit 402 receives a 24-bit (M-bit) value from data (data0<23:0>) 425, and provides a 25-bit output sum value as data (s<24:0>) 460. Cascaded adder circuit 402 also receives the "lsb" signal 218 from shift register 102 through buffer 406 (I726) as the "multiplier" signal 219 applied to a multiplier (multiplier) input of cascaded adder circuit 402. Cascaded adder circuit 402 also receives carry 0 signal 415 and carry 1 signal 417 from dummy input adder 430. Cascaded adder circuit 402 also receives a signal to its add (add) input from the done (done) output of dummy input adder 430 and "done_dummy" signal 418. Cascaded adder circuit 402 provides a carry 0 signal 414 and a carry 1 signal 416 to dummy output adder 420. Cascaded adder circuit 402 also provides to dummy output adder 420 a "done_23" signal 412 from the 24$^{th}$ adder within cascaded adder circuit 402. Dummy output adder 420 in turn provides a "done_step" signal 450 back to control circuitry 104, as shown in FIG. 3.

FIG. 5 depicts a more detailed block diagram of an embodiment of cascaded adder circuit 402. Adders 502a, 502b, 502c . . . 502x are cascaded together. The inputs to the first adder 502a (add, ci1, ci0) come from the "done_dummy" signal 418, the "ci1" signal 417, and the "ci0" signal 415 from the dummy input adder 430. The first adder 502a receives the "b" input value from AND gate 510a, which has the "multiplier" signal 219 and the least-significant-bit 425a (m<0>) of the M-bit data value 425 as inputs. The first adder 502a receives the "a", input value from the sum (s<1>) output 460b of the previous adder 502b. The first adder 502a provides a "done0" signal 522, a carry 1 (co1) signal 521, and a carry 0 (co0) signal 520 as outputs to the next adder 502b. The first adder 502a also provides a sum (s<0>) signal 460a as an output, which forms part of the summed output value 460 (s<24:0>) of cascaded adder circuit 402.

The second adder 502b receives the "b" input value from AND gate 510b, which has the "multiplier" signal 219 and the next bit 425b (m<1>) of the M-bit data value 425 as inputs. The second adder 502b receives the "a" input value from the sum (s<2>) output 460c of the previous adder 502c. The second adder 502b provides a "done1" signal 525, a carry 1 (co1) signal 524, and a carry 0 (co0) signal 523 as outputs to the next adder 502c. The second adder 502b also provides a sum (s<1>) signal 460b as an output, which forms part of the summed output value 460 (s<24:0>) of cascaded adder circuit 402.

The third adder 502c receives the "b" input value from AND gate 510c, which has the "multiplier" signal 219 and the next bit 425c (m<2>) of the M-bit data value 425 as inputs. The second adder 502c receives the "a" input value from the sum (s<3>) output 460d of the previous adder. The third adder 502c provides a "done2" signal 528, a carry 1 (co1) signal 527, and a carry 0 (co0) signal 526 as outputs to the next adder. The third adder 502c also provides a sum (s<1>) signal 460c as an output, which forms part of the summed output value 460 (s<24:0>) of cascaded adder circuit 402.

This cascading of adders continues on until the last adder 502x, which in the embodiment depicted in FIGS. 4–5 is the 24$^{th}$ adder. This last adder 502x receives the "b" input value from AND gate 510x, which has the "multiplier" signal 219 and the next bit 425x (m<23>) of the M-bit data value 425 as inputs. The last adder 502x receives the "a" input value from the sum (s<24>) output 460y of an extra flip-flop 541 (558), which has the "do_step" signal 314 through inverter 543 (I111) and the carry 1 (c01) signal 416 as inputs and which has the "ld" signal 310 as a control signal. The last adder 502x provides a "done23" signal 412, a carry 1 (co1) signal 416, and a carry 0 (co0) signal 414 as outputs to the dummy output adder 420. The last adder 502x also provides a sum (s<23>) signal 460x as an output, which forms part of the summed output value 460 (s<24:0>) of cascaded adder circuit 402.

Truth table of an adder gives the following well-known equation for the sum of the $j^{th}$ stage: $sj = aj \oplus bj \oplus cij$. The carry-in ci can be split into two signals: ci0 (carry-in of zero) and ci1 (carry-in of one). The sum can thus be split into two signals giving the dual-rail result:

$s1j = (aj \oplus bj) \cdot ci0j + (aj \odot bj) \cdot ci1j$ $s0j = (aj \oplus bj) \cdot ci1j + (aj \odot bj) \cdot ci0j$ Similarly, the expressions for dual-rail carry outs are derived as:

$$co1j = aj \cdot bj + (aj \oplus bj) \cdot ci1j$$

$$co0j = aj\_b \cdot bj\_b + (aj \oplus bj) \cdot ci0j$$

It is noted that in the above logic equations the symbol "⊕" represents an XOR operation, the symbol "⊙" represents an XNOR operation, the symbol "+" represents an OR operation, and the symbol "•" represents an AND operation.

According to the present invention, a start signal "go" is added to the adder design, changing the above equations to the following:

$$s1j = go \cdot [(aj \oplus bj) \cdot ci0j + (aj \odot bj) \cdot ci1j]$$

$$s0j = go \cdot [(aj \oplus bj) \cdot ci1j + (aj \odot bj) \cdot ci0j]$$

$$co1j = go \cdot [aj \cdot bj + (aj \oplus bj) \cdot ci1j]$$

$$co0j = go \cdot [aj\_b \cdot bj\_b + (aj \oplus bj) \cdot ci0j]$$

This signal "go" is used to enable the sum and carry-outs. When "go" is in logic state 0, sum and carry-outs from the adder are blocked.

In effect, a three-state code representation for the carry-in signals (ci1, ci0), carry-out signals (co1, co0), and sums (s1, s0) may be used. These pairs can assume one of the triple logical values (00, 01, 10). All these pairs start in logic state (00) and change to either state (01) or state (10) after the signal "go" is asserted. State (11) is not allowed. Furthermore, sum signal (s1, s0) assumes the state (10) or state (01) only after the carry-ins are in one of the two states (01) or (10). The completion signal for the $j^{th}$ adder can be taken either from the carry-out signals or from the sum signals. For a more robust design, the completion signal "done" may be derived using both, as follows:

$$donej = (s1j + s0j) \cdot (co1j + co0j)$$

This done signal signifies that the $j^{th}$ adder has successfully added, and the carry-outs and sums are valid.

FIG. 6 shows an embodiment of a detailed circuit design of an adder 600 according to the present invention, which includes a "go" signal and a completion "done" signal. The signal "go" is shown to be derived using additional control circuitry 650. Also shown is the flip-flop 652 (I91 dffrm), which has the "reset" signal 310 as an input, that operates to save the sum (s1) 640 and provide the "sum" signal 647 as an output. The "do_step" signal 314 is applied to AND gate 656 (I116) along with the "add" signal (ie., the "done" signal from the previous stage). The "do_step" signal 314 is also applied through inverter 654 (I111) to flip-flop 652 (I91 dffrm). The output of AND gate 656 (I116) is the "go" signal. In addition to the "go" signal, adder 600 includes inputs "a" and "b" as values that will be summed (along with carry-in values ci0 and ci1), which are provided to XOR gate 620 (I57). Adder 600 includes carry 1 "c01" output signal 646, carry 0 "co0" signal 648, and an addition completed "done" signal 649 as outputs to the next stage. Sum signal "s1" 640, sum signal "s0" 642, and the carry signals 646 and 648 are used to generate the "done" signal 649. As shown in FIG. 6, adder 600 may also be implemented by including: (1) NAND gates 610 (I52), 611 (I54), 612 (I58), 613 (I60), 614 (I61), 615 (I63), 616 (I68), 617 (I67), 618 (I66), and 619 (I65); (2) NOR gates 625 (I101), 626 (I102) and 627 (I69); (3) and inverters 630 (I55), 631 (I56), and 632 (I64).

Thus, as shown in FIG. 5, for the 24×28 bit multiplier, a row of adders consisting of 24 cascaded adders (each capable of generating completion signal) may be used. Using the adder 600 shown in FIG. 6, the signal "done" of $j^{th}$ adder is used to generate the start signal "go" for the $(j+1)^{th}$ adder. Thus, the $(j+1)^{th}$ adder cannot start adding unless it receives a completion signal from the previous $j^{th}$ adder. This ensures that the carry-ins to all adders in the row are propagated in a totally controlled manner, thus avoiding spurious transitions due to carry-propagation in conventional carry-propagate architectures, which do not include "done" signals.

In effect, a controlled hand-shake between the consecutive adders of the row is established, wherein the next adder waits for the previous adder to complete its addition. The completion signal "done" from the last adder in the row signifies the completion of one cycle of the iterative algorithm of the multiplication. For a 28-bit multiplier, it requires 28 internal cycles to finish the multiplication process. One cycle is completed when the "done" signals have propagated through the 24 cascaded adders. Two extra dummy adders may also be used on either side of the 24 cascaded adders, as shown in FIG. 4. These dummy adders avoid setup requirements of the flip-flops used to store the intermediate sums in the 24 cascaded adders, and also to allow the input signals to the first cascaded adder to settle before adding.

To control the iterative multiplication process, and to stop it at an appropriate time, control circuitry 104 may be utilized. On receiving a "do_mult" signal to perform a desired multiplication, control circuitry 104 initiates the process first by clearing the internal storage elements and loading the multiplier in the shift register 102, which is capable of being loaded asynchronously using preset and clear overrides.

Figure 8:
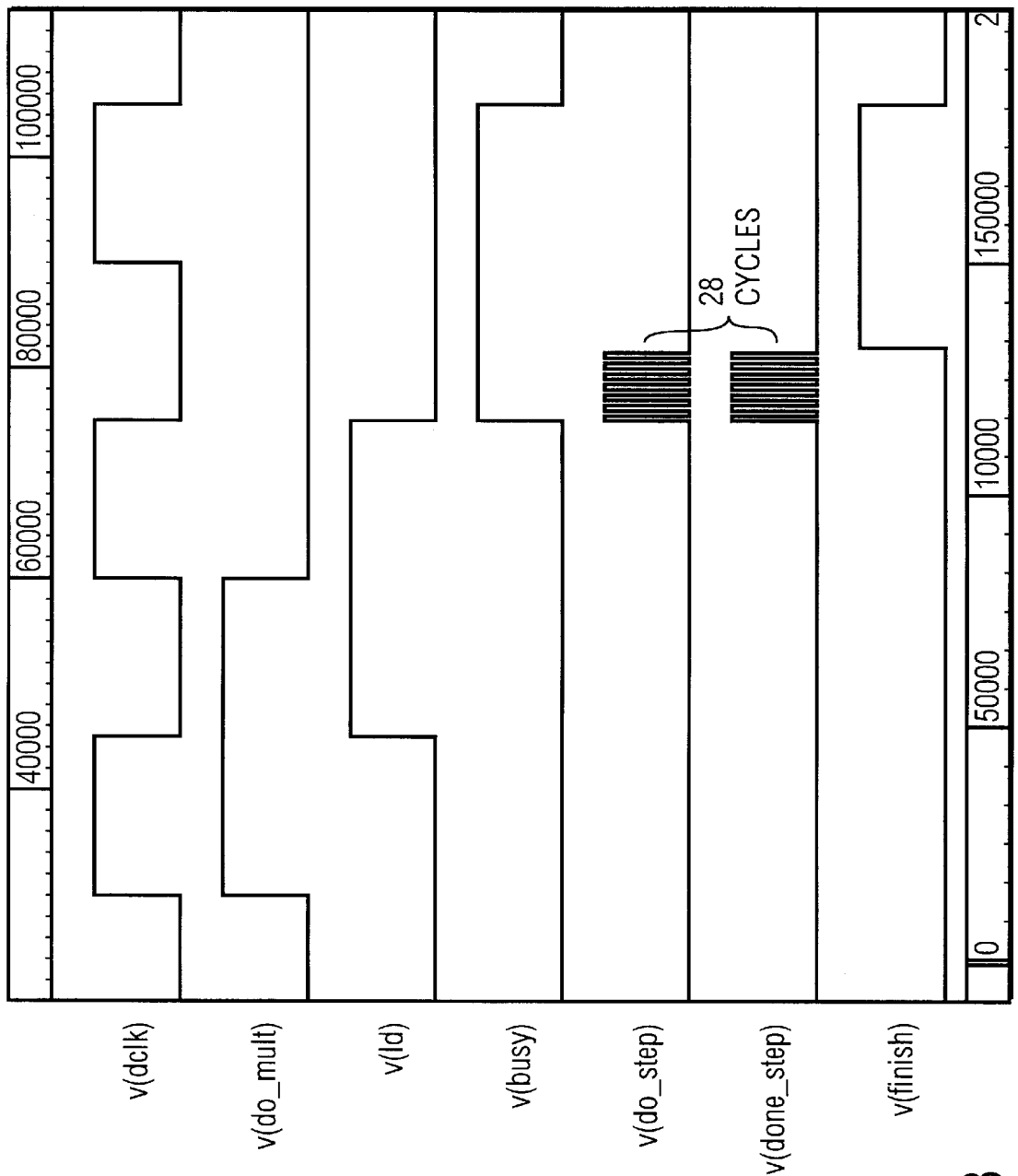
FIG. 8 is an example timing diagram for various signals associated with FIGS. 2, 3, 4, 5, 6, 7A and 7B.

An example timing diagram for the multiplication is shown in FIG. 8. In this example, the signal "do_mult" is required to be available one system clock cycle before the actual multiplication is needed. On the next falling edge after receiving signal "do_mult," the control circuitry generates a signal "ld", which is used to load the multiplier in a 28-bit shift register. The "ld" signal is also used to clear the flip-flops storing the intermediate sums in FIG. 6. On the next falling edge of the system clock, signal "busy" is generated. This signal "busy" is de-asserted after another system cycle. In FIG. 8, example voltages are provided for the "dclk" signal, the "do_mult" signal, the "ld" signal, the "busy" signal, the "do_step" signal, the "done_step" signal, and the "finish" signal. The horizontal axis also provides markings for every 40,000 ns at the top of FIG. 8, and markings for every 50,000 ns at the bottom of FIG. 8. The cycle time for the system clock represented by the "dclk" signal is approximately 30,500 ns, which corresponds to a system clock speed of 32.768 kHz.

Control circuitry 104 may include a finite-state-machine (FSM) and a counter to accomplish the required control. The counter may be held in a reset state whenever the signal "busy" is low. The FSM is defined by TABLE 1 below:

TABLE 1

| Control FSM | | |
| --- | --- | --- |
| Starting State | Next State | Transition Criteria |
| A | B | finish_b AND done_step_b AND busy |

TABLE 1-continued

Control FSM

| Starting State | Next State | Transition Criteria |
|---|---|---|
| A | A | busy_b OR finish OR done_step |
| B (do_step asserted) | B | done_step_b |
| B (do_step asserted) | A (do_step de-asserted) | done_step |

Before the multiplication starts, the FSM set forth in TABLE 1 above is residing in state A due to the fact that "busy" is low. Upon asserting "busy", this FSM goes to state B and a signal "do_step" is generated as the "finish" signal and the "done_step" signal are both low. This signal is used to initiate the iterative process and used as the signal "go" to the LSB adder (e.g., dummy input adder 430 in FIG. 4) of the row of cascaded adders. The completion signal "done" from the LSB adder is used to generate the start signal "go" to the next adder in the row. The "done" signal from the $j^{th}$ adder is used to generate the "go" for the $(j+1)^{th}$ adder.

Once the MSB adder (e.g., dummy output adder 420 in FIG. 4) completes the addition, its completion signal "done" signifies the end of one step of the iteration. This signal (shown as "done_step") is fed back to the FSM of the control circuitry. Upon receiving "done_step", FSM of the control circuitry goes back to state A, de-asserting the signal "do_step". Falling edge of the signal "do_step" is used to store the intermediate sums and also to shift the 28-bit shift register, shifting the multiplier one bit to the right, so that the next partial product can be formed and added to the stored results. De-asserting "do_step" also causes the "go" of all the adders of the row to go to logic level 0, thus forcing the pairs (ci1, ci0), (s1, s0), (co1, co0) to go to state (00) after the combinational logic delay of the adder. This in turn causes all of the "done" signals to be de-asserted, which also in turn causes the signal "done_step" to be de-asserted.

FSM of the control circuitry goes back to state B at this point of time and signal "do_step" is asserted again, making this chain of events start all over again. This process can go on repeatedly unless stopped by the counter. The counter keeps track of the number of cycles elapsed since the beginning of the multiplication and stops the multiplication after a predetermined number of cycles. For a 24×28 bit multiplication with 24 cascaded adders, for example, 28 cycles are needed for the multiplication. The counter may be held in a reset state while the signal "busy" is low. During multiplication, when "busy" is high, the counter is incremented on every rising edge of the signal "do_step". The counter asserts the "finish" signal after it has counted 28 cycles.

Thus, looking at FSM defined in TABLE 1 again, the counter issues the signal "finish" after the $28^{th}$ rising edge of "do_step", and the FSM is thereby forced to stay in state A after receiving the $28^{th}$ "done_step" signal. Multiplication stops at this time and the result is valid to be used as desired.

FIGS. 7A and 7B provide a detailed circuit diagram for an embodiment of control circuitry 700, according to the present invention. Control circuitry 700 may have the "done_step" signal 450, the "do_mult" signal 306, the "dclk" signal 302, and the "reset" signal 212 as inputs. Control circuitry 700 may have the "ld" signal 310, the "busy" signal 312, the "finish" signal 316, and the "do_step" signal 314 as outputs. The counter 302 may include the "do_step" signal 314 as the input to its clock (clk), and provide the output "finish" signal 316 when the multiplier has completed all 28 self-timed, internal cycles. As shown in FIGS. 7A and 7B, control circuitry 700 may also be implemented by including: (1) flip-flops 706 (I769) and 704 (I32); (2) NAND gates 710 (I28), 712 (I30), 714 (I29), 716 (I31), 718 (I27); and (3) inverters 720 (I770), 721 (I771), 722 (I772), 723 (I26), 724 (I25), 725 (I776), and 726 (I725).

Compared to a conventional synchronous implementations, the self-timed multiplier of the present invention suffers an area penalty due to the use of additional circuitry to control the self-timed process and due to the use of adder circuits capable of generating completion signals. Synchronous circuit architectures also require special design efforts to shut down the multiplier when it is not needed, whereas the self-timed architecture of the present invention has inherent power down capabilities. Although self-timed adder circuits according to the present invention may be roughly double the size of conventional adder circuits, the overall silicon area required is still far less than that required by fully parallel architectures, which can complete a desired multiplication in one system clock cycle. Furthermore, spurious transitions due to carry ripple effect of a parallel multiplier are avoided by using a controlled carry-propagation in the self-timed adder circuits contemplated by the present invention.

Because the self-timed implementation of the present invention requires the generation of completion signals for each addition, switching events occur as the sum signals and the carry signals transition from state (00) to either state (01) or (10) and back to state (00). Each switching event consumes power, and the self-timed implementation consumes data-independent power. The power consumed by the self-timed multiplier may be reduced, therefore, by adding circuitry to make the self-timed implementation and the power consumption data dependent.

Figure 9A:
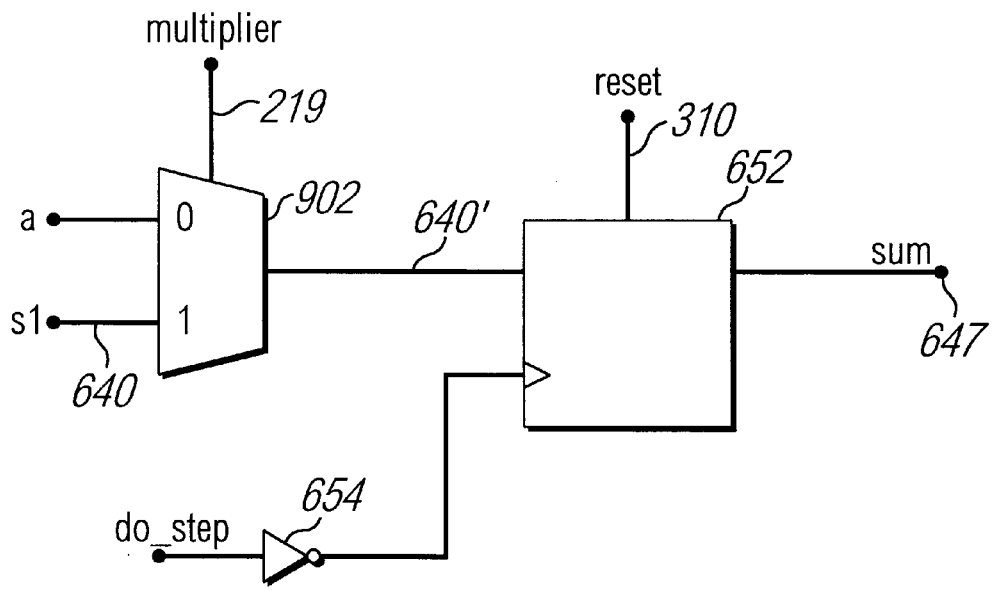
FIG. 9A is a diagram of additional adder circuitry, which allows the carry-propagate adder of FIG. 6 to be data dependent, according to the present invention.
Figure 9B:
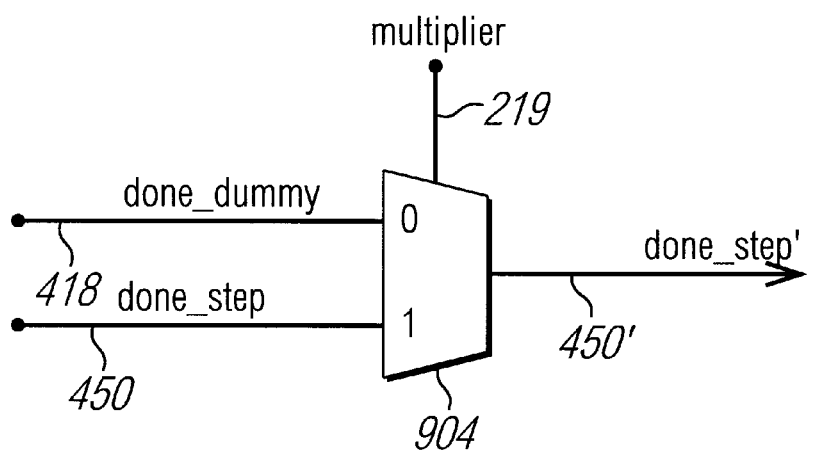
FIG. 9B is a diagram of additional circuitry to make the self-timed multiplier data dependent, according to the present invention.

FIG. 9A shows an additional circuit that may be added to the adder 600, and FIG. 9B shows an additional circuit that may be added to the control circuitry 700, to make the power consumption of the self-timed multiplier data dependent. In particular, FIG. 9A provides that flip-flop 652 in FIG. 6 has a multiplexed input from multiplexer 902. Multiplexer 902 may make a 2-bit selection based upon the "multiplier" signal 219, choosing the sum "s1" signal to latch if the "multiplier" signal is a logic level 1, and choosing the value "a" (i.e., the sum from the previous stage) if the "multiplier" signal is a logic level 0. Thus, the sum "s1" signal in FIG. 6 becomes the output 640' from multiplexer 902. Similarly, FIG. 9B provides that the "done_step" signal 450 to inverter 725 in FIG. 7 becomes the output "done_step'" signal 450' of multiplexer 904. Multiplexer 904 may make a 2-bit selection based upon the "multiplier" signal 219, choosing the "done_step" signal 450 to latch if the "multiplier" signal is a logic level 1, and choosing the value "done_dummy" signal 418 (i.e., "done" signal from the dummy input adder 430) if the "multiplier" signal is a logic level 0.

In operation, whenever the LSB of the shift register is 0, addition is not required and the only operation required is shifting of the sum stored by the adder flip-flops to the right by one bit in the cascaded adders. When this occurs with the additional circuitry of FIGS. 9A and 9B, signal "done_dummy" is used instead of "done_step" in the control circuitry, so that the signal "do_step" can be de-asserted as soon as possible, without the need of making all adders add 0 to the previous sums. Total time required to finish the multiplication decreases proportionately to the density of 0's of the multiplier stored in the shift register. The result is left intact in the flip-flops of the adders until the next multiplication is desired.

The present invention is particularly advantageous for ADCs with slow system clocks because it provides reduced latency by completing a required multiplication within one system clock cycle without using a parallel multiplier architecture to do so. Traditionally, phase locked loops (PLLs) have been used to generate internal clocks on chips whenever it is desired to operate the internal clock of an ADC at a higher rate compared to the external clock/system clock. Thus, a parallel architecture may be avoided by using a PLL for a multiplier circuit, but this approach carries with it the undesirable expense of designing a PLL into the device circuitry.

What is claimed is:

1. A self-timed multiplier for an analog to digital converter, comprising:
    self-timed circuitry within an analog to digital converter receiving an N-bit value and an M-bit value and performing an M×N bit multiplication;
    wherein said self-timed multiplier circuitry performs said M×N bit multiplication within a single internal clock cycle for said analog to digital converter, said multiplication occurring within a convolution cycle for said analog to digital converter.

2. The self-timed multiplier of claim 1, wherein said M×N bit multiplication is a gain compensation multiplication.

3. The self-timed multiplier of claim 2, wherein said N-bit value is a multiplier input from a digital filter and said M-bit value is a gain adjust input from a gain register.

4. The self-timed multiplier of claim 1, wherein said self-timed circuitry comprises a plurality of cascaded adder circuits producing internal timing signals.

5. The self-timed multiplier of claim 4, wherein said self-timed circuitry further comprises control circuitry indicating when said M×N multiplication has completed.

6. A self-timed multiplier for an analog to digital converter, comprising:
    self-timed circuitry within an analog to digital converter receiving an N-bit value and an M-bit value and performing an M×N bit multiplication;
    wherein said M×N bit multiplication is a gain compensation multiplication; and
    wherein said self-timed multiplier circuitry performs said gain compensation multiplication within a single internal clock cycle for said analog to digital converter, said gain compensation multiplication occurring within a convolution cycle for said analog to digital converter.

7. The self-timed multiplier of claim 6, wherein said analog to digital converter is a delta-sigma analog to digital converter.

8. A method for performing self-timed multiplications in an analog to digital converter, comprising:
    receiving an N-bit value;
    receiving an M-bit value;
    performing within an analog to digital converter a self-timed M×N bit multiplication; and
    wherein said performing step is completed within a single internal clock cycle for said analog to digital converter, said multiplication occurring within a convolution cycle for said analog to digital converter.

9. The method of claim 8, wherein said self-timed M×N bit multiplication performed is a gain compensation multiplication.

10. The method of claim 9, wherein said N-bit value received is a multiplier input from a digital filter and said M-bit value received is a gain adjust input from a gain register.

11. A method for performing self-timed multiplications in an analog to digital converter, comprising:
    receiving an N-bit value;
    receiving an M-bit value;
    performing within an analog to digital converter a self-timed M×N bit multiplication;
    wherein said self-timed M×N bit multiplication performed is a gain compensation multiplication; and
    wherein said performing step is completed within a single internal clock cycle for said analog to digital converter, said multiplication occurring within a convolution cycle for said analog to digital converter.

12. The method of self-timed multiplier of claim 11, wherein said analog to digital converter is a delta-sigma analog to digital converter.

13. A self-timed multiplier for an analog to digital converter, comprising:
    a self-timed adder circuit within an analog to digital converter including M cascaded adders which each have a product of one bit of an N-bit value and one bit of an M-bit value as an input; and
    control circuitry within said analog to digital converter coupled to said self-timed adder circuitry to apply each bit of said N-bit value to said M cascaded adders and to indicate when an M×N bit multiplication has completed;
    wherein said M×N bit multiplication is performed within a single internal clock cycle for said analog to digital converter, said multiplication occurring within a convolution cycle for said analog to digital converter.

14. The self-timed multiplier system of claim 13, wherein said M cascaded adders are carry propagate adders.

15. The self-timed multiplier system of claim 13, further comprising a N-bit shift register storing said N-bit value.

16. The self-timed multiplier system of claim 14, wherein said self-timed adder circuit is data dependent, being idle if said N-bit value is a logic "0" and being functional if said N-bit value is a logic "1".

17. A method of performing a self-timed multiplication for an analog to digital converter, comprising:
    applying one bit of an N-bit value and one bit of an M-bit value to self-timed adder circuitry including M cascaded adders within an analog to digital converter;
    allowing additions to propagate through said self-timed adder circuitry;
    repeating said applying and allowing steps for each bit of said N-bit value; and
    providing a M×N bit multiplication result;
    wherein said providing step comprises providing said M×N bit multiplication result within a single internal clock cycle for said analog to digital converter, said multiplication occurring within a convolution cycle for said analog to digital converter.

18. The method of claim 17, wherein said analog to digital converter is a delta-sigma analog to digital converter.

19. The method of claim 18, wherein said N-bit value is a multiplier input from a digital filter, said M-bit value is a gain adjust input from a gain register, and said M×N bit multiplication result is a gain compensated data output.

20. A self-timed adder circuit for a self-timed multiplier in an analog to digital converter, comprising:
    a plurality of cascaded adder circuits within an analog to digital converter to perform an M×N bit multiplication, each of said adder circuits being inactive until a control signal is asserted and producing a completion signal which is applied to a next adder circuit as said control signal for said next adder circuit;

wherein said M×N bit multiplication is performed within a single internal clock cycle for said analog to digital converter, said multiplication occurring within a convolution cycle for said analog to digital converter.

21. The self-timed adder circuit of claim 20, wherein an input value to each of said plurality of cascaded adder circuits is a product of one bit from an M-bit value and one bit from an N-bit value, said M-bit value and said N-bit value associated with a desired M×N bit multiplication for said analog to digital converter.

22. The self-timed adder circuit of claim 21, wherein said desired M×N bit multiplication is a gain compensation multiplication for a delta-sigma analog to digital converter.

23. The self-timed adder circuit of claim 21, wherein said plurality of cascaded adder circuits are shifted by one bit if said one bit from said N-bit value is a logic "0".

24. A method for self-timing additions for a self-timed multiplier in an analog to digital converter, comprising:

providing a plurality of cascaded adder circuits;

utilizing an adder circuit of said plurality of cascaded adder circuits to produce a summed value;

generating a completion signal to identify when said first adder circuit has completed an addition and said summed value has been produced;

providing said completion signal from said adder circuit to a next adder circuit of said plurality of cascaded adder circuits;

repeating said utilizing, generating, and providing steps for each of said plurality of cascaded adder circuits; and generating an M×N bit multiplication result within a single internal clock cycle for said analog to digital converter, said multiplication occurring within a convolution cycle for said analog to digital converter.

25. The method of claim 24, wherein said utilizing step for each adder circuit includes receiving a value representative of a summed value from a previous adder circuit and a value representative of a product of a bit from an M-bit value and a bit from an N-bit value.

26. A delta-sigma analog to digital converter, comprising:

an analog modulator receiving an analog input;

a digital filter connected to said analog modulator and providing digitized output; and a self-timed multiplier performing a multiplication utilizing said digitized output;

wherein said self-timed multiplier performs said multiplication within a single internal clock cycle for said analog to digital converter, said multiplication occurring within a convolution cycle for said analog to digital converter.

27. The delta-sigma analog to digital converter of claim 26, further comprising a gain register storing a gain value, and wherein said self-timed multiplier performs a gain compensation multiplication utilizing said gain value and said digitized output.

28. A delta-sigma analog to digital converter system, comprising:

analog input circuitry;

a delta-sigma analog to digital converter receiving an analog input from said analog input circuitry and utilizing a self-timed multiplier to produce a digitized output, said self-timed multiplier receiving a digitized value from a digital filter and a gain adjust value from a gain register as inputs with one of said inputs being a parallel input and the other being a serial input to said self-timed multiplier; and a serial data interface communicating with said delta-sigma analog to digital converter to receive said digitized output.

* * * * *